United States Patent [19]

Shozima

[11] Patent Number: 4,480,221

[45] Date of Patent: Oct. 30, 1984

[54] LEVEL METER CIRCUIT

[75] Inventor: Kazuo Shozima, Tokyo, Japan

[73] Assignee: Trio Kabushkik Kaisha, Tokyo, Japan

[21] Appl. No.: 292,221

[22] Filed: Aug. 12, 1981

[30] Foreign Application Priority Data

Aug. 14, 1980 [JP] Japan .................... 55-115473[U]

[51] Int. Cl.³ .................................. G01R 31/00
[52] U.S. Cl. ................................ 324/96; 340/660
[58] Field of Search .................... 324/96, 122, 133; 340/660

[56] References Cited

U.S. PATENT DOCUMENTS

| | | |
|---|---|---|
| 3,818,495 | 6/1974 | Sagara et al. .................. 324/96 |
| 4,004,220 | 1/1977 | Kerber et al. .................. 324/96 |
| 4,065,716 | 12/1977 | O'Brien .......................... 324/96 |
| 4,096,435 | 6/1978 | Sabe .............................. 324/96 |
| 4,166,245 | 8/1979 | Roberts .......................... 324/96 |
| 4,241,342 | 12/1980 | Merriweather ................. 324/96 |

Primary Examiner—Stewart J. Levy
Attorney, Agent, or Firm—Gerald J. Ferguson, Jr.; Joseph J. Baker

[57] ABSTRACT

A level meter circuit for displaying the level of an input signal by the use of a number of light emitting diodes. The circuit has a parallel circuit of a plurality of unit circuits each having a diode circuit and a current control transistor connected in series with the parallel circuit and controlled by the input signal, the level of which is to be displayed. In accordance with the input signal level to be displayed, one or more of the diodes are activated to emit light, thus providing a display of the input signal level.

6 Claims, 1 Drawing Figure

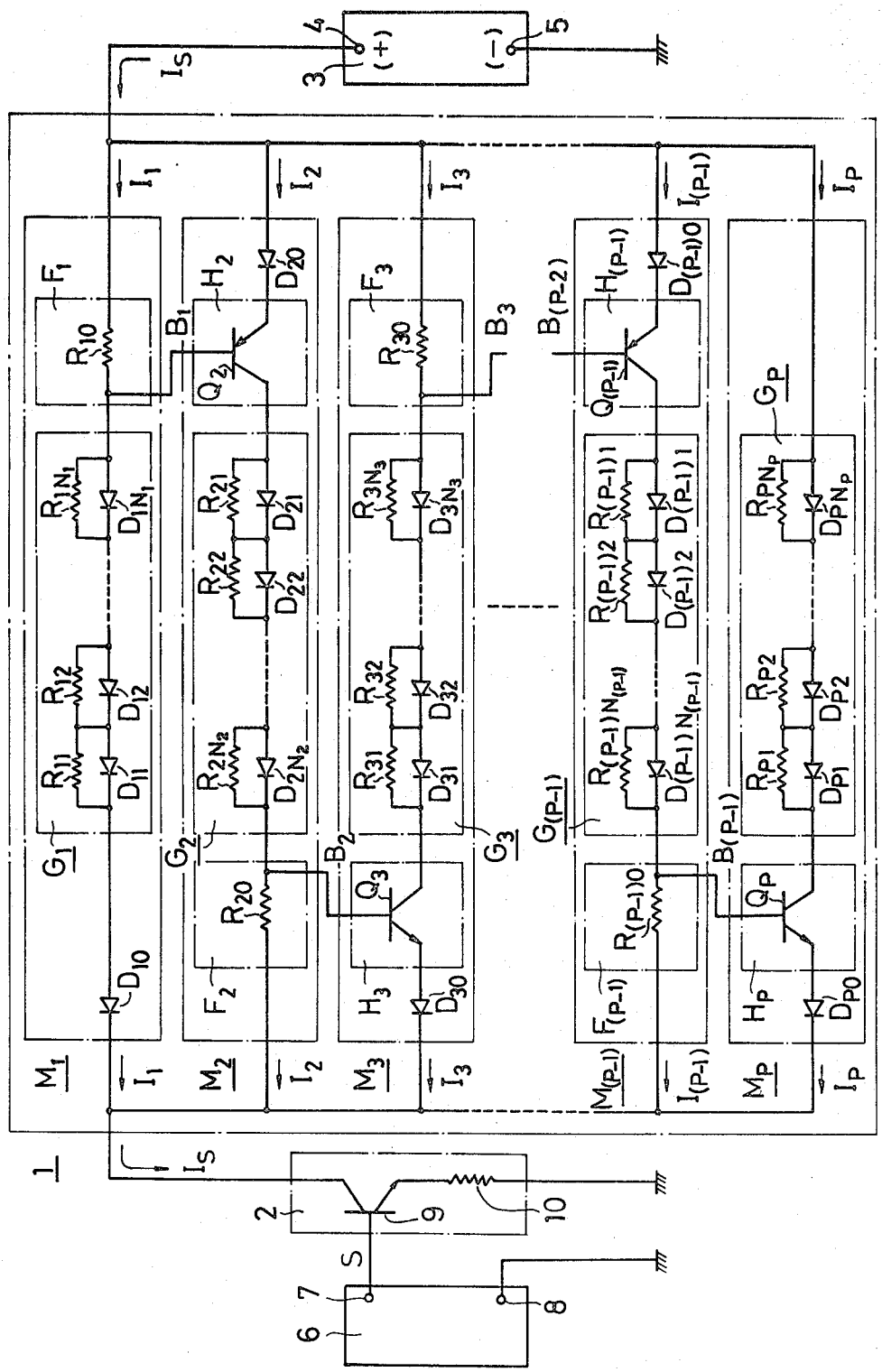

LEVEL METER CIRCUIT

BACKGROUND OF THE INVENTION

1. Field of the Invention

The present invention relates to a level meter circuit for displaying the level of an input signal by the use of a number of light emitting diodes.

2. Description of the Prior Art

Therefore there have been proposed various level meter circuits of the type displaying the input level through utilization of a large number of light emitting diodes. One of such conventional level meter circuits has a number of comparators respectively corresponding to the light emitting diodes and a number of reference signal sources respectively corresponding to the comparators. The light emitting diodes are each driven by one of the comparators corresponding thereto. The comparators each compare the output from one of the reference signal sources corresponding thereto and the input signal the level of which is to be displayed. The level of the input signal is displayed by lighting those of the light emitting diodes which correspond in number to the input signal level.

As noted above such a prior art level meter circuit calls for comparators and reference signal sources of the same number as the light emitting diodes used, and hence it has the defects of bulkiness, complexity and expensiveness.

SUMMARY OF THE INVENTION

It is therefore an object of the present invention to provide a novel level meter circuit which is free from the abovesaid defects of the prior art.

According to the present invention, the level meter circuit is provided with a parallel circuit of a plurality of unit circuits and current control means, such as a transistor, which is connected in series with the parallel circuit and controlled by the input signal the level of which is to be displayed. The unit circuits each has a diode circuit, which is composed of a plurality of series-connected diodes and current bypass resistors, each connected in parallel with one of the diodes. The unit circuits except one of them are each provided with current detecting means, such as a resistor, which is connected in series with the diode circuit. Further, the unit circuits except another one of them are each provided with current control means, such as a transistor, which is connected in series with the diode circuit and controlled by the current detecting means. In accordance with the input signal level to be displayed, one or more of the diodes are activated to emit light, thus providing a display of the input signal level.

Accordingly, the level meter circuit of the present invention is able to display the input signal level with a simple circuit arrangement and does not require the utilization of numbers of comparators and reference signal sources such as have been employed in the aforementioned conventional level meter circuit. Therefore, the level meter circuit of the present invention has the advantages of small and simple structure and low manufacturing cost.

Other objects, features and advantages of the present invention will become more fully apparent from the following detailed description taken in conjunction with the accompanying drawing.

BRIEF DESCRIPTION OF THE DRAWING

The accompanying drawing is a connection diagram illustrating an embodiment of the level meter circuit of the present invention.

DESCRIPTION OF THE PREFERRED EMBODIMENT

The illustrated embodiment of the level meter circuit has a parallel circuit 1 of a parallel connection of P unit circuits $M_1$ to $M_P$ and a main current control circuit 2 connected in series with the parallel circuit 1. The following description will be given on the assumption that P is an odd number for the sake of simplicity. The one end of the series circuit on the side of the parallel circuit 1 is connected to a positive terminal 4 of a power source 3 and the other end on the side of the main current control circuit 2 is connected via the ground to a negative terminal 5 of the power source 3.

The main current control circuit 2 is supplied, via output terminals 7 and 8 of an input signal source 6, with an input signal S the level of which is to be displayed. The main current control circuit 2 is controlled by the input signal S so that a current $I_S$ flowing via the circuit 2 from the power source 3 to the parallel circuit 1 may assume a value (which is identified by the same reference character $I_S$ as the current $I_S$ for the sake of brevity) corresponding to the level (which is identified by $V_S$). Such a current control circuit 2 may be a known one.

An example of the current control circuit 2 has an NPN type current control transistor 9 of relatively high output impedance. The transistor 9 has its collector connected to one end of the parallel circuit 1 and has it emitter grounded via a resistor 10 and consequently it is connected in series with the parallel circuit 1 via a resistor 10. The input signal source 6 is connected at the one end 7 to the base of the transistor 9 and grounded at the other end 8. The transistor 9 is controlled by the input signal S so that the current $I_S$ flowing therethrough to the parallel circuit 1 may take the value $I_S$ corresponding to the level $V_S$ of the input signal S.

The unit circuit $M_i$ ($i = 1, 2, \ldots P$) has a diode circuit $G_i$.

The unit circuits $M_1$ to $M_{(P-1)}$ except the circuit $M_P$ respectively have current detecting circuits $F_1$ to $F_{(P-1)}$ which are connected in series with the diode circuits $G_1$ to $G_{(P-1)}$, respectively. The current detecting circuits $F_1, F_3, F_5, \ldots F_{(P-2)}$ are respectively connected in series with the diode circuits $G_1, G_3, G_5, \ldots G_{(P-2)}$ on the opposite side from the main current control circuit 2 and the current detecting circuits $F_2, F_4, F_6, \ldots F_{(P-1)}$ are respectively connected in series with the diode circuits $G_2, G_4, G_6, \ldots G_{(P-1)}$ on the side of the main current control circuit 2.

The unit circuits $M_2$ to $M_P$, other than that $M_1$, respectively have current control circuits $H_2$ to $H_P$ which are connected in series with the diode circuits $G_2$ to $G_P$, respectively. The current control circuits $H_2, H_4 \ldots H_{(P-1)}$ are respectively connected in series with the diode circuits $G_2, G_4, G_6, \ldots G_{(P-1)}$ on the opposite side from the main current control circuit 2. The current control circuits $H_3, H_5, H_7, \ldots H_P$ are respectively connected in series with the diode circuits $G_3, G_5, G_7, \ldots G_P$ on the side of the main current control circuit 2.

The unit circuit $M_i$ has a light emitting diode $D_{i0}$ connected in series with the diode circuit $G_i$. The diode $D_{10}$ is connected in series with the diode circuit $G_1$ on the side of the main current control circuit 2 and the diodes $D_{30}$, $D_{50}$, $D_{70}$, ... $D_{P0}$ are respectively connected in series with the diode circuits $G_3$, $G_5$, $G_7$, ... $G_P$ on the side of the main current control circuit 2. The diodes $D_{20}$, $D_{40}$, $D_{60}$, $D_{(P-1)0}$ are respectively connected in series with the diode circuits $G_2$, $G_4$, $G_6$, ... $G_{(P-1)}$ on the opposite from the main current control circuit 2. In this case, the diodes $D_{10}$, $D_{30}$, $D_{50}$, ... $D_{P0}$ have their cathodes on the side of the main current control circuit 2 and the diodes $D_{20}$, $D_{40}$, $D_{60}$, ... $D_{(P-1)0}$ have their anodes on the side of the power source 3.

Accordingly, in the unit circuit $M_1$ there are connected in series the current detecting circuit $F_1$, the diode circuit $G_1$ and the diode $D_{10}$ are connected in this order from the side opposite from the main current control circuit 2. Therefore, the current $I_1$ flows from the power source 3, to the current detecting circuit $F_1$, the diode circuit $G_1$ and the diode $D_{10}$ as a current which is provided via the unit circuit $M_1$ to the main current circuit 2. In the unit circuits $M_1$ to $M_{(P-1)}$, there are respectively connected in series the the diodes $D_{10}$ to $D_{(P-1)0}$, the current control circuits $H_1$ to $H_{(P-1)}$, the diode circuits $G_1$ to $G_{(P-1)}$ and the current detecting circuits $F_1$ to $F_{(P-1)}$ in this order from the side opposite from the main current control circuit 2. Therefore, the currents $I_1$ to $I_{(P-1)}$ respectively flow from the power source 3 to the diodes $D_{10}$ to $D_{(P-1)0}$, the current control circuits $H_1$ to $H_{(P-1)}$, the diode circuits $G_1$ to $G_{(P-1)}$ and the current detecting circuits $F_1$ to $F_{(P-1)}$ as currents which are respectively provided via the unit circuits $M_1$ to $M_{(P-1)}$ to the main current control circuit 2. In the unit circuit $M_p$ there are connected in series the diode circuit $G_P$, the current control circuit $H_p$ and the diode $D_{P0}$ in this order from the side opposite from the main current control circuit 2. Therefore, the current $I_P$ flows from the power source 3 to the diode circuit $G_P$, the current control circuit $H_P$ and the diode $D_{P0}$ as a current which is provided via the unit circuit $M_P$ to the main current control circuit 2. The current detecting circuits $F_1$ to $F_{(P-1)}$ of the unit control circuits $M_1$ to $M_{(P-1)}$ detect the value of the currents $I_1$ to $I_{(P-1)}$ (which values are respectively identified by the same $I_K$ to $I_{(P-1)}$ as the current $I_1$ to $I_{(P-1)}$ for the sake of simplicity) and respectively provide the detected outputs as control signals $B_1$ to $B_{(P-1)}$.

The current control circuits $H_2$ to $H_P$ of the unit circuits $M_2$ to $M_P$ are respectively controlled by the control signals $B_1$ to $B_{(P-1)}$ from the current detecting circuits $F_1$ to $F_{(P-1)}$.

Assume that the level $V_S$ of the input signal S from the input signal source 6 assumes values $V_{S0}$, $V_{S1}$, $V_{S2}$, ... $V_{SP}$. Let it be assumed in this case, that the levels $V_{S0}$, $V_{S1}$, $V_{S2}$, ... $V_{SP}$ bear the following relationships:

$$V_{S0}(=0) < V_{S1} < V_{S2} < \ldots < V_{S(p-1)} < V_{SP} \quad (1)$$

$$|V_{S0} - V_{S1}| \simeq |V_{S1} - V_{S2}| \simeq \ldots$$
$$\simeq |V_{S(P-1)} - V_{SP}| \simeq V_a \ldots \quad (2)$$

Let $I_{S0}$, $I_{S1}$, $I_{S2}$, ... $I_{SP}$ represents the levels of the current $I_S$ which flows in the parallel circuit 1 and the current control circuit 2 when the input signal S assumes the levels $V_{S0}$, $V_{S1}$, $V_{S2}$, ... $V_{SP}$, respectively. Assume, in this case, that the levels $I_{S0}$, $I_{S1}$, $I_{S2}$, ... $I_{SP}$ bear the following relationships:

$$I_{S0}(=0) < I_{S1} < I_{S2} < \ldots I_{S(P-1)} < I_{SP} \ldots \quad (3)$$

$$|I_{S0} - I_{S1}| \simeq |I_{S1} - I_{S2}| \simeq \ldots |I_{S(P-1)} - I_{SP}| \simeq I_a \ldots \quad (4)$$

Since the unit circuit $M_1$ has no current control circuit if the level $V_S$ of the input signal S is varied analogously from $V_{S0}$ to $V_{SP}$, the level of the current $I_S$ undergoes an analogous change from $I_{S0}(=0)$ to $I_{SP}$.

In the case where the current $I_S$ varies analogously from the level $I_{S0}(=0)$ to $I_{S1}$, the current $I_1$ flowing in the unit circuit $M_1$ undergoes an analogous change from the level $I_{S0}(=0)$ to $I_{S1}$. In this case, however, the current control circuit $H_2$ of the unit circuit $M_2$ is not controlled to be operative by the control signal $B_1$ from the current detecting circuit $F_1$ of the unit circuit $M_1$, so that the current $I_2$ flowing in the unit circuit $M_2$ remains at the zero level. Therefore, the currents $I_3$ to $I_p$ of the other unit circuits $M_3$ to $M_p$ also remain at the zero level. That is, in this case, only the current $I_1$ of the unit circuit $M_1$ varies from the level $I_{S0}$ to $I_{S1}$, while the currents $I_2$ to $I_p$ of the unit circuits $M_2$ to $M_p$ remain at the zero level.

When the current $I_S$ varies analogously from the level $I_{S1}$ to $I_{S2}$, the current $I_1$ of the unit circuit $M_1$ is saturated at a level $|I_{S0} - I_{S1}| = I_a$. The control circuit $H_2$ of the unit circuit $M_2$ is controlled to be operative by the control signal $B_1$ which is fed from the current detecting circuit $F_1$ of the unit circuit $M_1$ in this case. The current control circuit $H_2$ produces a great change in the level of the current $I_2$ in response to a very slight change in the level of the control signal $B_1$. In consequence, the current $I_2$ of the unit circuit $M_2$ varies analogously from the level $I_{S0}$ to $I_{S1}$. In this case, however, the current control circuit $H_3$ of the unit circuit $M_3$ is not controlled to be operative by the control signal $B_2$ which is derived from the current detecting circuit $F_2$ in this case, so that the current $I_3$ of the unit circuit $M_3$ remains at the zero level. Accordingly, the currents $I_4$ to $I_p$ of the unit circuits $M_4$ to $M_P$ are also held at the zero level. As a result of this, the current $I_1$ of the unit circuit $M_1$ is saturated substantially at the level $I_a$ and the current $I_2$ of the unit circuit $M_2$ undergoes an analogous change from the level $I_{S0}$ to $I_{S1}$ and the currents $I_3$ to $I_P$ of the unit circuits $M_3$ to $M_P$ are retained at the zero level.

In the case where the current $I_S$ changes from the level $I_{S2}$ to $I_{S3}$, the currents $I_1$ and $I_2$ of the unit circuits $M_1$ and $M_2$ are saturated substantially at the level $I_a$. The current control circuits $H_3$ of the unit circuit $M_3$ is controlled to be operative by the control signal $B_2$ from the current detecting circuit $F_2$ of the unit circuit $M_2$, causing the current $I_3$ of the unit circuit $M_3$ to change analogously from the level $I_{S0}$ to $I_{S1}$. In this case, however, the current control circuit $H_4$ of the unit circuit $M_4$ is not controlled to be operative by the control signal $B_3$ from the current detecting circuit $F_3$, so that the current $I_4$ of the unit circuit $M_4$ remains at the zero level. Accordingly, the currents $I_5$ to $I_p$ of the other unit circuits $M_5$ to $M_P$ also remain at the zero level. As a result of this, the currents $I_1$ and $I_2$ of the unit circuits $M_1$ and $M_2$ are saturated substantially at the level $I_a$ and the current $I_3$ of the unit circuit $M_3$ varies from the level $I_{S0}$ to $I_{S1}$ and the currents $I_4$ to $I_p$ of the unit circuits $M_4$ to $M_P$ are held at the zero level.

In the case where the current $I_S$ similarly undergo analogous changes from the levels $I_{S3}$ to $I_{S4}$, $I_{S4}$ to $I_{S5}$ ... $I_{S(P-2)}$ to $I_{S(P-1)}$, the currents $I_1$ to $I_3$, $I_1$ to $I_4$, ... $I_1$ to $I_{(P-2)}$ of the unit circuits $M_1$ to $M_3$, $M_1$ to $M_4$ ... $M_1$ to $M_{(P-2)}$ saturated substantially at the level $I_a$ and the currents $I_4$, $I_5$ ... $I_{(p-1)}$ of the unit circuits $M_4$, $M_5$ ...

$M_{(P-1)}$ vary from the level $I_{S0}$ to $I_{S1}$ and the currents $I_5$, $I_6 \ldots I_{(P-1)}$ of the unit circuits $M_5$, $M_6 \ldots M_{(P-1)}$ remain at the zero level.

In the case where the current $I_S$ varies analogously from the level $I_{S5}$ to $I_{S6}$, the currents $I_1$ to $I_{(P-1)}$ of the unit circuits $M_1$ to $M_{(P-1)}$ are saturated substantially at the level $I_a$ and the current $I_P$ of the unit circuit $M_P$ varies from the level $I_{S0}$ to $I_{S1}$.

Further, even if the current $I_S$ varies in excess of the level $I_{SP}$, the currents $I_1$ to $I_P$ of the unit circuits $M_1$ to $M_P$ are saturated substantially at the level $I_a$.

Specific example of the current detecting circuits $F_1$ to $F_{(P-1)}$ of the unit circuits $M_1$ to $M_{(P-1)}$ are respectively constituted by resistors $R_{10}$ to $R_{(P-1)0}$ which are connected in series with the diode circuits $G_1$ to $G_{(P-1)}$ of the unit circuits $M_1$ to $M_{(P-1)}$, respectively. The current control circuits $H_2$ $H_4$, $H_6$, $H_{(P-1)}$ have, for example, PNP type current control transistors $Q_2$, $Q_4$, $Q_6, \ldots Q_{(P-1)}$ of relatively high output impedance, which respectively have their collectors connected to the diode circuits $G_2$, $G_4$, $G_6$, $\ldots G_{(P-)1}$ at one end thereof, their emitters connected to the cathodes of the diodes $D_{20}$, $D_{40}$, $D_{60}$, $\ldots D_{(P-1)0}$ and their bases connected to the resistors $R_{10}$, $R_{30}$, $R_{50}$, $\ldots R_{(P-2)0}$ of the current detecting circuits $F_1$, $F_3$, $F_5$, $\ldots F_{(P-2)}$ on the side of the diode circuits $G_1$, $G_3$, $G_5$, $\ldots G_{(P-2)}$. The current control circuits $H_3$, $H_5$, $H_7$, $\ldots H_P$ have, for example, NPN type current control transistors $Q_3$, $Q_5$, $Q_7, \ldots Q_P$ of relatively high output impedance, which respectively have their collectors connected to the diode circuits $G_3$, $G_5$, $G_7$, $\ldots G_P$ at one end thereof, their emitters connected to the anodes of the diodes $D_{30}$, $D_{50}$, $D_{70}$, $\ldots D_{P0}$ and their bases connected to the resistors $R_{20}$, $R_{40}$, $R_{60}$, $\ldots R_{(P-1)0}$ of the current detecting circuits $F_2$, $F_4$, $F_6$, $\ldots F_{(P-1)}$ on the side of the diode circuits $G_2$, $G_4$, $G_6$, $\ldots G_{(P-1)}$. Accordingly, the transistors $Q_2$ to $Q_P$ are respectively connected in series with the diode circuit $G_k$ and respectively controlled by the voltage drops across the resistors $R_{10}$ to $R_{(P-1)0}$ of the current detecting circuit $F_{(k-1)}$. In practice, the resistance values $r_{10}$, $r_{20}$, $\ldots r_{(P-1)0}$ of the resistors $R_{10}$, $R_{20}$, $\ldots R_{(P-1)0}$ bear the following relationships:

$$r_{10} \cong r_{20} \cong \ldots \cong r_{(P-1)0} \ldots \quad (5)$$

The transistors $Q_2$, $Q_4$, $\ldots Q_{(P-1)}$ have the same characteristic and the transistors $Q_3$, $Q_5$, $\ldots Q_P$ also have the same characteristic.

The diode circuit $G_i$ are provided with plural, $N_i$, series-connected light emitting diodes $D_{i1}$, $D_{i2}$, $\ldots D_{iNi}$ and current bypassing resistors $R_{i1}$, $R_{i2}$, $\ldots R_{iNi}$ connected in parallel with the diodes $D_{i1}$, $D_{i2}$, $\ldots D_{iNi}$, respectively. In this case, the resistance values $r_{i1}$, $r_{i2}$, $\ldots r_{iNi}$ are suitably selected in such a range that they bear the following relationships:

$$r_{i1} < r_{i2} < \ldots r_{iN(i-1)} < r_{iNi} \ldots \quad (6)$$

In practice, the numbers $N_1$, $N_2$, $\ldots N_P$ are equal to the diodes $D_{11}$ to $D_{1N}$, $D_{21}$ to $D_{2N2} \ldots D_{P1}$ to $D_{PNP}$ have the same characteristic as the aforesaid diodes $D_{10}$ to $D_{P0}$. Further, there are the following relationships:

$$r_{11} \cong r_{21} \cong \ldots \cong r_{P1} \quad (7)$$

$$r_{12} \cong r_{22} \cong \ldots \cong r_{P2} \quad (7)$$

$$r_{13} \cong r_{23} \cong \ldots \cong r_{P3} \quad (7)$$

In the foregoing, it is described that in the case where the current $I_S$ flowing through the parallel circuit 1 changes analogously from level $I_{S0}(=0)$ to the level $I_{S1}$ as the level $V_S$ of the input signal S varies analogously from $V_{S0}(=0)$ to $V_{S1}$, the current $I_1$ of the unit circuit $M_1$ changes from the level $I_{S0}$ to $I_{S1}$ but the currents $I_2$ to $I_P$ of the unit circuits $M_2$ to $M_P$ remain at the zero level. Consider the case where the input signal S assumes $(N_1 + 2)$ levels $V_{D0}(=I_{S0})$, $V_{D1}$, $V_{D2}, \ldots V_{DN1}$, $V_{D(N1+1)}(=V_{S1})$ when the input signal level $V_S$ *varies from* $v_{S0}$ to $v_{S1}$. In this case, let it be assumed that the levels bear the following relationships:

$$V_{D0}(V_{S0}=0) < V_{D1} < \ldots < V_{DN1} < V_{D(N_1+1)}(=V_{S1}) \ldots \quad (8)$$

$$|V_{D0} - V_{D1}| \cong |V_{D1} - V_{D2}| \cong \ldots$$
$$\cong |V_{D(N1-1)} - V_{DN1}| \cong |V_{DN1} - V_{D(N+1)}| \cong V_b \ldots \quad (9)$$

Let $I_{D0}(=I_{S0}=0)$, $I_{D1}$, $I_{D2}, \ldots I_{DN1}$, $I_{D(N1+1)}(=I_{S1})$ represent the levels of the current $I_S$ when the level $V_S$ of the input signal S assumes the values $V_{D0}$, $V_{D1}, \ldots V_{DN1}$, $V_{D(N1+1)}$ respectively. In this case, the levels of the current $I_S$ bear such relationships as follows:

$$I_{D0}(=I_{S0}) < I_{D1} < I_{D2} < \ldots < I_{DN1} < I_{D(N1+1)}(=I_{S1}) \ldots \quad (10)$$

but let it be assumed that they bear the following relationships:

$$|I_{D0} - I_{D1}| \cong |I_{D1} - I_{D2}| \cong \ldots$$
$$\cong |I_{D(N1-1)} - I_{DN1}| \cong I_b \ldots \quad (11)$$

When the current $I_S$ undergoes an anlogous change from the level $I_{D0}(=I_{S0}=0)$ to the level $I_{D1}$, the current $I_1$ of the unit circuit $M_1$ varies analogously from the level $I_{D0}(=I_{S0}=0)$ to the level $I_{D1}$. A current flowing in the diode $D_{10}$ of the unit circuit $M_1$ has the same level as does the current $I_1$ flowing in the unit circuit $M_1$. The currents flowing in the diodes $D_{11}$, $D_{12}, \ldots D_{1N1}$ have lower levels than the current $I_1$. The currents flowing in the diodes $D_{11}$, $D_{12}, \ldots D_{1N1}$ become greater in this order. The reason for which such relationship is obtained is that the current bypassing resistors $R_{11}$, $R_{12}, \ldots R_{1N1}$ having the relationships expressed by the equation (6). When the level of the current $I_1$ becomes $I_{D1}$, the diode $D_{10}$ is turned ON or lighted but the other diodes $D_{11}$ to $D_{1N1}$ remain unlighted. In the case where the level of the current $I_S$ changes analogously from $I_{D1}$ to $I_{D2}$, the current $I_1$ also undergoes an analogous change from the level $I_{D1}$ to $I_{D2}$. In this while the diode $D_{10}$ is supplied with a current which varies analogously from the level $I_{D1}$ to $ID_2$ but since the level of this current is higher than the level $I_{D1}$, the diode $D_{10}$ remains lighted. When the level of the current $I_1$ becomes $I_{D2}$, the diode $D_{11}$ is lighted but the other diodees $D_{12}$ to $D_{1N1}$ remain unlighted. In the case where the current $I_S$ varies analogously from the level $I_{D2}$ to $I_{D3}$, the current $I_1$ also varies analogously from the level $I_{D2}$ to $I_{D3}$. In this while the diodes $D_{10}$ and $D_{11}$ remain lighted. When the level of the current $I_1$ becomes $I_{D3}$, the diode $D_{12}$ is lighted but the other diodes $D_{13}$ to $D_{1N1}$ are not lighted. Similarly, when the level of the current $I_S$ varies analogously from the levels $I_{D3}$ to $I_{D4}$, $I_{D4}$ to $I_{D5} \ldots I_{D(N1-1)}$ to $I_{DN1}$, the current $I_1$ also varies analogously from the levels $I_{D3}$ to $I_{D4}$, $I_{D4}$ to $I_{D5} \ldots I_{D(N1-1)}$ to $I_{DN1}$. In this while the diodes $D_{12}$, $D_{13} \ldots D_{1(N1-2)}$ keep on lighting. When the level of the current $I_1$ becomes $I_{d4}$, $I_{D5} \ldots$ $I_{DN1}$, the diodes $D_{13}, D_{14} \ldots D_1(N-1)$ are lighted but the other diodes $D_{14}$ to $D_{1N1}, D_{15}$ to $D_{1N1} \ldots D_{1N1}$ remain unlighted. When the level of the current $I_1$ becomes $I_{D(N1+1)}(=I_{S1})$, all the diodes $D_{10}$ to $D_{1N1}$ are lighted.

Consequently, the diodes $D_{10}, D_{11}, D_{12}, D_{13}, \ldots D_{1N1}$ of the unit circuit $M_1$ are sequentially lighted as the level $V_S$ of the input signal S varies analogously from $V_{S0}$ to $V_{S1}$.

In the above it is described that in the case where the current $I_S$ varies analogously from the level $I_{S1}$ to $I_{S2}$ as the level $V_S$ of the input signal S from $V_{S1}$ to $V_{S2}$, the current $I_1$ is saturated substantially at the level $I_1$ and the current $I_2$ of the unit circuit $M_2$ varies analogously from the level $I_{S0}$ to $I_{S1}$ and the currents $I_3$ to $I_P$ of the unit circuits $M_3$ to $M_P$ remain at the zero level. While the current $I_2$ of the unit circuit $M_2$ varies analogously from the level $I_{S0}$ to $I_{S1}$, all the diodes $D_{10}$ to $D_{1N1}$ of the unit circuit $M_1$ keep on lighting. When the current $I_2$ changes analogously from the level $I_{S0}$ to $I_{S1}$, the diodes $D_{20}, D_{21}, D_{22}, \ldots D_{2N2}$ of the unit circuit $M_2$ are lighted in this order. The reason is as follows: The diodes $D_{20}, D_{21}, D_{22}, \ldots$ respectively correspond to the diodes $D_{10}, D_{11}, D_{12}, \ldots$ of the unit circuit $M_1$; the resistors $R_{21}, R_{22}, R_{23}, \ldots$ respectively correspond to the resistors $R_{11}, R_{12}, R_{13} \ldots$ of the unit circuit $M_1$; and the analogous variation of the current $I_2$ of the unit circuit $M_2$ from the level $I_{S0}$ to $I_{S1}$ corresponds to the analogous variation of the current $I_1$ of the unit circuit $M_1$ from the level $I_{S0}$ to $I_{S1}$ in the case where the current $I_S$ varies analogously from the level $I_{S0}$ to $I_{S1}$.

Accordingly, when the level $V_S$ of the input signal S varies analogously from $V_{S1}$ to $V_{S2}$, the diodes $D_{20}, D_{21}, D_{22}, \ldots D_{2N2}$ of the unit circuit $M_2$ are sequentially lighted in this order, with all the diodes $D_{10}$ to $D_{1N1}$ of the unit circuit $M_1$ being lighted.

Similarly, when the level $V_S$ of the input signal S varies analogously from $V_{S3}$ to $V_{S4}$, $V_{S4}$ to $V_{S5} \ldots V_{S(P-1)}$ to $V_{SP}$, the diodes $D_{30}$ to $D_{3N3}$, $D_{40}$ to $D_{4N4} \ldots D_{P0}$ to $D_{PNp}$ of the unit circuits $M_3, M_4 \ldots M_p$ are sequentially lighted respectively, with all the diodes ($D_{10}$ to $D_{1N1}$) to ($D_{20}$ to $D_{2N2}$), ($D_{10}$ to $D_{1N1}$) to ($D_{30}$ to $D_{3N3}$), $\ldots$ ($D_{10}$ to $D_{1N1}$) to ($D_{(P-1)0}$ to $D_{(P-1)N(P-1)}$) of the unit circuits $M_1$ to $M_2$, $M_1$ to $M_3$, $\ldots M_1$ to $M_{(P-1)}$ being lighted. When the level $V_S$ of the input signal S exceeds $V_{SP}$, all the diodes ($D_{10}$ to $D_{1N1}$) to ($D_{P0}$ to $D_{PNP}$) of all the unit circuits $M_1$ to $M_P$ are lighted.

Therefore, when the level $V_S$ of the input signal S varies analogously from $V_{S0}(=0)$ to $V_{SP}$ or more, the diodes $D_{10}, D_{11}, D_{12}, \ldots D_{1N1}, D_{20}, D_{21}, D_{22}, \ldots D_{2N2}, D_{30}, D_{31}, \ldots D_{(P-1)N(P-1)}, D_{P0}, D_{P1}, \ldots D_{PNP}$ are sequentially lighted in this order. And if the level $V_S$ of the input signal S further varies analogously from $V_{SP}$ or more to $V_{S0}$, the diodes $D_{PNP}, D_{PN(P-1)}, \ldots D_{P0}, D_{(P-1)NP-1}, D_{(P-1)(Np-1-1)}, \ldots D_{(P-1)0}, D_{(P-2)N(P-2)}, \ldots D_{2N2}, D_2(N_1-1) \ldots D_{20}, D_{1N1}, D_{1(N1-1)}, \ldots D_{11}, D_{10}$ are sequentially turned OFF in this order.

Accordingly, by arranging the diodes $D_{10}, D_{11}, D_{12}, \ldots D_{1N1}, D_{20}, D_{21}, D_{22}, \ldots D_{2N2}, D_{30}, D_{31}, D_{32}, \ldots D_{(P-1)N(P-1)} D_{P0}, D_{P1}, D_{P2} \ldots D_{PNP}$ in this order, the diodes of the number counted from the beginning of their arrangement corresponding to the level $V_S$ of the input signal S are turned displaying the level $V_S$ of the input signal S.

As has been described in the foregoing, the illustrated level meter circuit of the present invention is provided with the parallel connection circuit 1 of the unit circuits $M_1$ to $M_P$ and the main current control circuit 2 which is connected in series with the parallel circuit 1 and controlled by the input signal S. The unit circuit $M_i$ has the diode circuit $G_i$ provided with the light emitting diodes $D_{il}$ to $D_{iNi}$ and the current bypassing resistors $R_{il}$ to $R_{iNi}$ respectively connected in parallel with the diodes $D_{il}$ to $D_{iNi}$ and a light emitting diode $D_{i0}$ connected in series with the diode circuit $G_i$; the unit circuits $M_1$ to $M_{(P-1)}$ have respectively the current detecting circuits $F_1$ to $F_{(p-1)}$ which are connected in series with the diode circuits $G_1$ to $G_{(p-1)}$, respectively; and the unit circuits $M_2$ to $M_P$ have the current control circuits $H_2$ to $H_P$ which are connected in series with the diode circuits $G_2$ to $G_p$, respectively and controlled by the current detecting circuits $F$ to $F_{(p-1)}$, respectively. According to the present invention, it is possible to display the level of the input signal S with such a simple circuit arrangement. Accordingly, the level meter circuit of the present invention can be made small, simple and inexpensive. Further, by increasing the number P of the unit circuits $M_1$ to $M_P$ without increasing the number $N_i$ of the diodes $D_{il}$ to $D_{iNi}$ in the diode circuit $G_i$ of the unit circuit $M_i$, the level of the input signal S can be displayed over a wider range. This means that the diodes are all lighted at the same brightness. Accordingly, there can be produced a visually beautiful display of the level of the input signal S.

The foregoing embodiment should be construed as being merely illustrative of the present invention. For example, in the illustrated arrangement of the level meter circuit of the present invention, the diodes $D_{20}$ to $D_{P0}$ of the unit circuits $M_2$ to $M_P$ can be omitted. Also it is possible to leave out the diode $D_{10}$ in the unit circuit $M_1$.

In the foregoing it has been described that as the current $I_S$ flowing in the parallel circuit 1 sequentially increases by the same amount of level, the currents $I_2, I_3, \ldots I_P$ respectively flow in the unit circuits $M_2, M_3, \ldots M_P$ in a sequential order, and that the currents $I_1, I_2, \ldots I_P$ flowing in the unit circuits $M_1, M_2, \ldots M_P$ assume the same saturation level. It is also possible, however, that by suitably arranging the current detecting circuits $F_1$ to $F_{(P-1)}$ and the current control circuits $H_2$ to $H_P$, as the current $I_S$ sequentially increases by an amount of level different from that of the immediately previous current increase, the currents $I_2, I_3, \ldots I_P$ respectively flow in the unit circuits $M_2, M_3, \ldots M_P$ in a sequential order, and that the currents $I_1, I_2, \ldots I_P$ assume different saturation levels. Further, it has been described in the foregoing that each time the current $I_i$ sequentially increases by the same amount of level, the diodes $D_{i0}, D_{i1}, \ldots D_{iNi}$ in the unit circuit $M_i$ are each lighted in a sequential order by suitably selecting the values $r_{i1}$ to $r_{iN1}$ of the the resistors $R_{i1}$ to $R_{iN1}$ within the range that satisfies the equation (6). It is also possible, however, that each time the current $I_i$ increases by an amount of level different from that of the immediately previous current increase, the abovesaid diodes are each lighted in a sequential order.

It will be apparent that many modifications and variations may be effected without departing from the scope of the novel concepts of this invention.

What is claimed is:

1. A level meter circuit comprising:
   a parallel circuit of P unit circuits $M_1, M_2, \ldots M_p$; and main current control means connected in series with the parallel circuit and controlled by an input signal the level of which is to be displayed;

wherein the unit circuit $M_i$ (i=1, 2, ... P) has a diode circuit $G_i$, the diode ciruit $G_i$ having $N_i$ series-connected light emitting diodes $D_{i1}, D_{i2}, \ldots D_{iN_i}$ and current bypassing resistors $R_{i1}, R_{i2}, \ldots R_{iN_i}$ respectively connected in parallel with the light emitting diodes $D_{i1}, D_{i2}, \ldots D_{iN_i}$, and the current bypassing resistors $R_{i1}, R_{i2}, \ldots R_{iN_i}$ having smaller resistance values in this order;

wherein the unit circuits $M_1$ to $M_{(P-1)}$ respectively have current detecting circuits $F_1$ to $F_{(P-1)}$ which are connected in series with the diode circuits $G_1$ to $G_{(P-1)}$, respectively; and wherein the unit circuits $M_2$ to $M_P$ respectively have current control circuits $M_2$ to $M_P$ which are connected in series with the diode circuits $G_2$ to $G_P$ respectively and controlled by the current detecting circuits $F_1$ to $F_{(P-1)}$ respectively.

2. A level meter circuit according to claim 1 wherein the unit circuit $M_1$ has a light emitting diode $D_{10}$ connected in series with the diode circuit $G_1$.

3. A level meter circuit according to claim 1 wherein the main current control means has a current control transistor connected in series with the parallel circuit.

4. A level meter circuit according to claim 1 wherein the unit circuits $M_2$ to $M_P$ respectively have light emitting diodes $D_{20}$ to $D_{P0}$ which are connected in series with the diode circuits $G_2$ to $G_P$, respectively.

5. A level meter circuit according to claim 1 wherein the current detecting circuits $F_1$ to $F_{(P-1)}$ respectively have current detecting resistors $R_{10}$ to $R_{(P-1)0}$ which are connected in series with the diode circuits $G_1$ to $G_{(P-1)}$, respectively.

6. A level meter circuit according to claim 1 wherein the current control circuits $H_2$ to $H_P$ have current control transistors $Q_2$ to $Q_P$ which are connected in series with the diodes circuits $G_2$ to $G_P$, respectively.

* * * * *